United States Patent [19]

Beery et al.

[11] Patent Number: 4,798,134

[45] Date of Patent: Jan. 17, 1989

[54] PRESSURE COMPENSATED SINGLE NIP THREE-ROLL PRESS

[75] Inventors: Jack Beery; Erik K. Nelson, both of Centerville, Ohio; John J. Shelton, Tuttle, Okla.

[73] Assignee: The Mead Corporation, Dayton, Ohio

[21] Appl. No.: 95,372

[22] Filed: Sep. 11, 1987

[51] Int. Cl.[4] ............................................. B30B 3/02
[52] U.S. Cl. ................................. 100/171; 100/159; 100/160; 100/176; 118/117
[58] Field of Search .............. 100/160, 162 B, 163 A, 100/163 R, 169, 171, 176, 159; 118/114, 653, 116, 117; 427/365, 361; 72/242, 243

[56] References Cited

U.S. PATENT DOCUMENTS

| | | |
|---|---|---|
| Re. 32,126 | 4/1986 | Sasaki . |
| 2,850,952 | 9/1958 | Hornbostel . |
| 3,736,869 | 6/1973 | Motter et al. ............... 100/162 B X |
| 4,192,229 | 3/1980 | Tsunoi et al. . |
| 4,194,382 | 3/1980 | Kajiwara ............................. 72/243 |
| 4,235,157 | 11/1980 | Tsunoi . |
| 4,343,234 | 8/1982 | Sasaki . |
| 4,356,764 | 11/1982 | Haugen ...................... 100/162 B X |
| 4,369,646 | 1/1983 | Kajiwara ............................. 72/243 |
| 4,406,139 | 9/1983 | Schiffers .................... 100/162 B X |
| 4,441,416 | 4/1984 | Tsutsumi ............................ 100/171 |
| 4,480,459 | 11/1984 | Feldman et al. ............ 100/162 B X |
| 4,502,312 | 3/1985 | Marchioro .................. 100/162 B X |
| 4,691,548 | 9/1987 | Richter et al. .................... 72/243 X |

*Primary Examiner*—Andrew M. Falik
*Attorney, Agent, or Firm*—Biebel, French & Nauman

[57] ABSTRACT

A three-roll press for a web including a pair of pressing rolls forming a nip and a pressure roll bearing on one of the pressing rolls in which the deflection curve of one of the pressing rolls is matched to that of the other pressing roll by the application of a biasing force to the one pressing roll urging its end toward the pressure roll by an amount which is proportional to the internal moment in the one pressing roll at locations corresponding to the edges of a web in the nip therebetween. A compensating spring is employed to urge the one pressing roll toward the pressure roll. The pressing roll may be a crowned roll or a skewed roll.

8 Claims, 2 Drawing Sheets

PRESSURE COMPENSATED SINGLE NIP THREE-ROLL PRESS

BACKGROUND OF THE INVENTION

This application relates to three-roll presses, and more particularly to a pressure compensated single nip three-roll press for calendering or pressing web material and the like, with a uniform force across the nip.

A particular use for such presses is the fixing of a toner image on a toner image support member as shown in Tsunoi et al, U.S. Pat. No. 4,192,229 issued Mar. 11, 1980; Sasaki, U.S. Pat. No. 4,343,234 issued Aug. 10, 1982; and Sasaki, Re. No. 32,126 reissued Apr. 29, 1986. A further particular application of a roll-type press, in which a uniformly high pressure is required along a nip between a pair of pressing rolls, is the rupturing of photosensitive microcapsules on a surface coating carried on a web or sheet of material.

U.S. Pat. Nos. 4,440,846 and 4,339,209, assigned to the same assignee as this invention and incorporated herein by reference, describe an imaging system wherein a photosensitive layer, comprising microcapsules containing a photosensitive composition in the internal phase, is image-wise exposed to actinic radiation and subjected to a uniform rupturing force whereupon the microcapsules rupture and image-wise release the internal phase. The imaging system is particularly advantageous because it is a totally dry system and does not rely upon the application of wet developing processing solutions to produce the image. An imaging-forming chromogenic material, such as a substantially colorless former, is typically associated with the microcapsules.

When the microcapsules rupture, the color former image-wise reacts with the developer material and produces a color image. In the embodiments described in the referenced patents, the microcapsules are typically ruptured by passing image-wise exposed imaging sheets through the nip between a pair of parallel calender rolls.

The media may exist in either single sheet or two-sheet versions. In the former, the microcapsules and developer composition are both coated onto a single substrate layer. In the latter, the microcapsules are carried on a first substrate layer, referred to as a donor sheet. The developer composition is coated onto a second, separate substrate layer, referred to as a receiver sheet. The donor sheet is subjected to the actinic radiation, and the exposed microcapsule layer is then brought into contact with the developer layer of the receiver sheet. The two sheets are then developed by pressure, with the finished image being formed in the receiver sheet.

Skewed rolls have been suggested for use in such apparatus. However, unsatisfactory results can be obtained where the skewed roll comes into contact with the image bearing material, since the skew in such a roll, satisfactory to achieve a sufficient force and a force distribution, can create an excessive shear in the media which can degrade the developed image. In order to avoid unwanted shear, four-roll developers have been suggested, employing two uniform diameter nip-forming pressing rolls, and a pair of crowned compensating rolls. The rolls of uniform diameter provide a constant velocity for the media bearing material at the nip, while the crowned rolls provide a uniform force when properly deflected, against the uniform rolls. While this concept is capable of producing superior results, the use of four rolls increases complexity, weight and cost.

Three-roll presses are disclosed in the above-identified U.S. Pat. Nos. 4,192,229; 4,343,234 and Re. No. 32,126. In each case a pair of cylindrical, parallel, nip-defining pressing rolls are employed together with a third compensating roll, the latter being either crowned or mounted on an axis skewed to the parallel rolls. The intermediate roll, that is the roll between the compensating roll and a first roll, is allowed to float, although it may be journalled or restrained at its ends so that it remains in parallelism with its nip-defining first roll, when loaded by the compensating pressure roll. Such arrangements, as defined, are deficient in that they fail to take into account the fact that the deflection curves between the parallel pressing rolls cannot be accurately matched at regions near the edges of the web, regardless of loading, as long as the intermediate roll is free-floating at its ends.

SUMMARY OF THE INVENTION

This invention is directed to a three-roll press employing a pair of pressing rolls and a force compensating pressure roll which is either skewed with respect to the axis of the roll pair, or is crowned, and in which the mismatch of internal moments at the edge of the web between the pressing rolls is compensated to provide a condition of matched deflection between the nip-forming pressure rolls. This invention is based on the recognition that the internal moments at locations corresponding to the edges of the web, at the intermediate or floating roll, is zero, whereas there is a finite and positive moment in the other of the pair of cylindrical rolls defining the nip, at the same locations. According to this invention, a compensating force is applied to the intermediate roll in an amount proportionate to the moment in the first roll at the edges of the web and under conditions where the compensating roll imposes an evenly distributed load on the intermediate roll.

In the practice of this invention it is preferred that the cylindrical pressing rolls, defining the present nip, be of substantially the same length. It is not necessary that they be of the same diameter, and it may be preferred to have the intermediate roll of a smaller diameter. It is also preferred that each of the three rolls be formed of essentially the same material, to simplify calculations. The compensating force is preferably applied to the remote ends of the intermediate roll, outboard of its cylindrical working section portion, by suitable loading means which may take the form of springs, such as leaf springs, which are appropriately deflected under load to the desired amount.

It is accordingly an object of this invention to provide a three roll press in which a uniformly high pressure is generated across the width of a web in a nip between a pair of parallel, cylindrical pressing rolls loaded by a compensating pressure roll which may be either crowned, or skewed in relation to the axes of the pressing rolls.

A further object of the invention is the provision, in a three roll press, of an intermediate roll compensator which applies a compensating force to the ends of an intermediate roll to more accurately match the deflection curve of the intermediate roll to a nip-forming pressure roll.

These and other objects and advantages of the invention will be apparent from the following description, the accompanying drawings, and the appended claims.

DESCRIPTION OF PREFERRED EMBODIMENT

Figure 1:
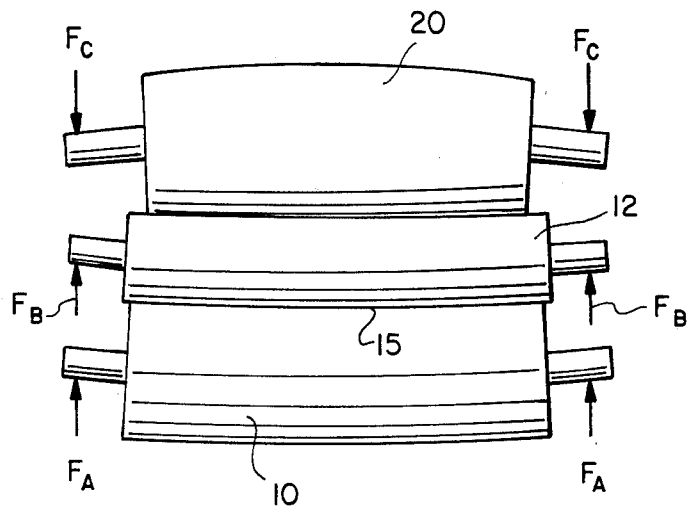
FIG. 1 is a diagrammatic front view of a three-roll developer made in accordance with this invention.
Figure 4:
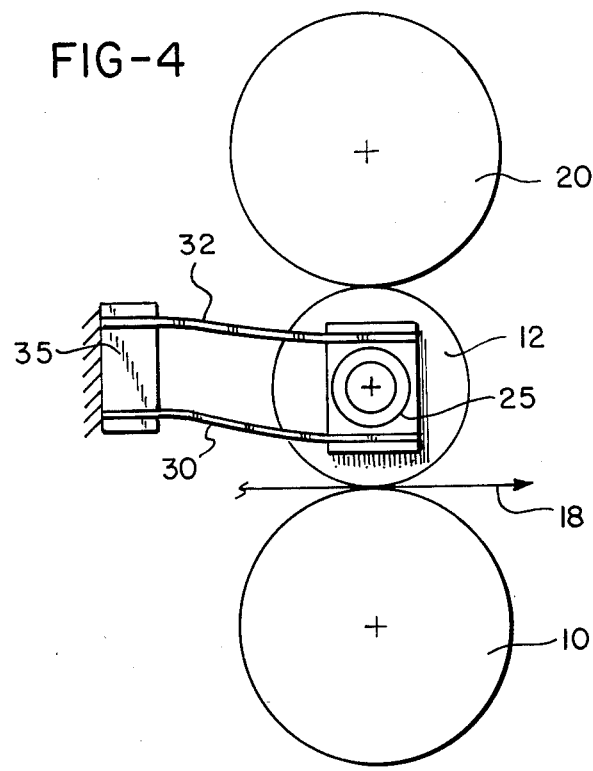
FIG. 4 is a somewhat diagrammatic side elevational view showing one manner of providing a compensating force to the intermediate roll.

Referring to the figures of the drawing, which illustrate a preferred embodiment of this invention, a three-roll type calender press is shown diagrammatically in FIG. 1. The press of FIG. 1 includes a lower cylindrical pressing roll 10, and a superimposed or intermediate cylindrical pressing roll, 12. The axes of rolls 10 and 12 are parallel and the rolls are in nip-defining relation to each other, at a transverse nip 15, for accepting therebetween a sheet or web of media bearing material, as illustrated generally by the web 18 in FIG. 4. It will be understood that, for the purpose of this discussion, rolls 10 and 12 are preferably of substantially the same width and are wider than the web 18. Also, while the upper or intermediate cylindrical pressing roll 12 is shown as having a diameter somewhat less than that of the roll 10, it will be understood that these rolls may be of the same diameter or in appropriate circumstances, the intermediate roll 12 may be larger.

Figure 5:
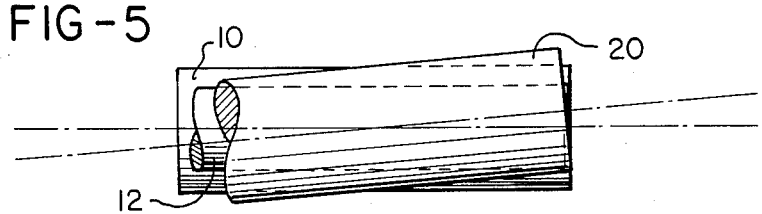
FIG. 5 is a diagrammatic plan view of a three-roll press in which the axis of the pressure roll is skewed to the axes of the pressing rolls.

Means for pressure loading the pressing rolls 10 and 12 include a pressure roll 20 as illustrated in FIG. 1. The pressing roll 20, comprising the upper roll of the stack as illustrated in FIG. 1, may be a roll on a skewed axis, (FIG. 5) but is preferably a crowned roll, as illustrated in FIG. 1. Further, the illustration in FIG. 1 shows in exaggerated form, the concurrent deflections of the roll stack when roll 20 is loaded at its ends by a loading force $F_C$. The crowned roll 20 is mounted for rotation about an axis which is in the plane which passes through the respective axes for rolls 10 and 12. In other words, the roll stack comprising the rolls 10, 12 and 20 have axes which are in a straight line. It will further be understood, for the purpose of this analysis, that the rolls may have outboard bearings, that the pressure roll 10 is rotatably mounted in a suitable frame, and supports the pressure applied thereto, through the roll 12, by the force $F_C$ applied to the crowned roll. Also, for the purpose of this analysis, the weights of the rolls are neglected, and all deflections are considered as elastic deflections. Further, the roll 10 is allowed to deflect freely under the distributed force which is required across the operating nip 15. The intermediate roll 12 is loaded by the crowned roll 20, so that the intermediate roll 12 tends to conform to the shape of the pressure roll 10, along the nip, at the desired distributed nip force.

As noted above, in the absence of a compensating force, it is not possible to match the deflection curve of rolls 10 and 12. Stated more accurately, it is not possible to match the deflection curve of roll 12 to that of roll 10, where the intermediate roll 12 is free-floating. This fact and the description of the compensating force required, is discussed below in which the subscripts A, B and C refer respectively to forces, parameters, or conditions relating to rolls 10, 12 and 20.

Figure 2:
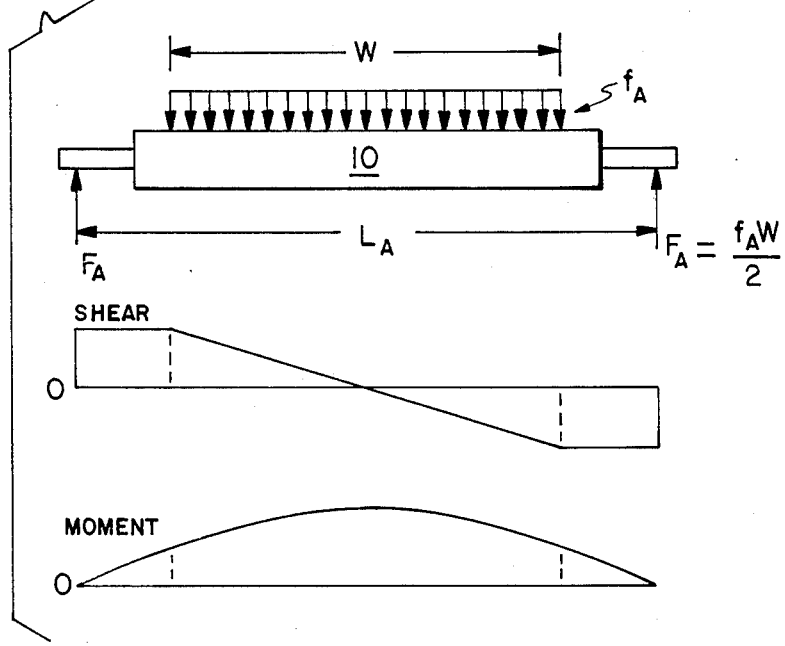
FIG. 2 is a force diagram showing the relationship between moment and shear in one of the rolls.

If the reaction force at each of the bearings for the first pressing roll 10 is $F_A$, then this reacting force will be equal to $fW/2$, where f is the centered distributed nip load between the rolls 10 and 12 and W is the width of the web 18. This distributed load over the width W is illustrated diagrammatically in FIG. 2. FIG. 2 further illustrates the shear and moment diagrams for the loading condition of the roll 10, corresponding to the width W of the web 18 at the nip 15.

It is also assumed for the purpose of this analysis that the loading is confined to the width of the web. The moment M in the roll 10 at either edge of the web 18 may be expressed as:

$$[f_A W/2][L_A - W]/2 \qquad \text{(No. 1)}$$

where $L_A$ is the distance between the bearing centers of roll 10.

As noted above, the deflection curves of roll 10 and free-floating roll 12 cannot be matched near the transverse edges of the web 18 since the internal moment at locations corresponding to such edges is a positive value for roll 10, as expressed in equation No. 1 above, whereas a free-floating intermediate roll, by definition, has an internal moment at the edges of the web which is zero.

In further explanation, the elementary theory of defection of beams is based on the equation:

$$\frac{d^2 y}{dx^2} = \frac{M}{EI} \qquad \text{(No. 2)}$$

where x is the distance along the beam, y is the deflection (the second derivative of y with respect to x is the curvature), M is the moment in the beam as a function of x at any point, E is the modulus of elasticity, and I is the area moment of inertia as a function of x at any point. Two beams will have identical defections if and only if their curvatures are identical functions of x and they have a known point of equal deflection and slope. From equation (2), the curvatures are equal at all points if and only if the ratios M/EI are equal at all points.

This invention provides compensating means for a matching of the deflection curves of rolls 10 and 12, and for this purpose, the computations are simplified by assuming that the spacings between the bearings for roll 12 is the same as that for the corresponding support bearing for roll 10. One of the bearings for roll 12 is diagrammatically illustrated in FIG. 4 as bearing 25, and it will be seen that the bearing 25, in the fully loaded condition, is biased in such a direction as to press roll 12 with a force $F_B$ into engagement with the crowned roll 20 by pairs of loading springs 30 and 32. The springs capture the bearings 25 therebetween, and have remote ends which are clamped between clamping blocks 35. The springs 30 and 32, accumulatively, provide or impart a force on a constant force on each of the bearings 25 equal to:

$$f_A W [L_B / L_A]/2 \qquad \text{(No. 3)}$$

in the condition in which the rolls are fully loaded. Equation No. 3 above assumes that the crowned roll 20 imposes an evenly distributed load equal to:

$$f_A [1 + L_B / L_A] \qquad \text{(No. 4)}$$

Figure 3:
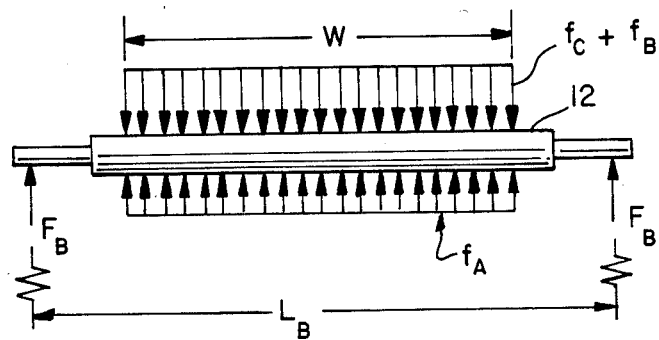
FIG. 3 is a force diagram showing the loading of the intermediate roll according to this invention.

This balanced condition is diagrammatically represented as the force imparted by the spring pairs 30, 32 at $F_B$ in FIG. 3.

By way of example, without limiting the scope of the invention, a three-roll press according to this invention has been designed to apply a load $f_A$ on the web 18 across the effective width of the nip 15, of 500 pounds per linear inch (pli). The following additional parameters apply.

Sheet width W: 297 mm (11.693 inches);
Spacing between the bearings 25: $L_{A,B}=345$ mm;
Diameter of roll 10: $D_A=50$ mm (1.9685 in.);
Diameter of roll 12: $D_B=35$ mm (1.3780 in.);
Roll material steel, each of the same alloy.

In this example, the rolls are analyzed as beams cantilevered at their centers. The deflections caused by the distributed loading are separated from the deflections caused by the reactions to facilitate design.

For the distributed load $f_A$:

$$y_A = -\frac{f_A}{24EI}x^4 + \frac{F_A W}{12EI_A}x^3 - \frac{f_A W^2}{16EI_A}x^2 \quad \text{(No. 5)}$$

$$y_A = \frac{f_A W^4}{48EI_A}\left[-2\left(\frac{X}{W}\right)^4 + 4\left(\frac{X}{W}\right)^3 - 3\left(\frac{X}{W}\right)^2\right] \quad \text{(No. 6)}$$

For the concentrated load $F_A$ on the extended shaft $$y_A = -\frac{F_A}{6EI}x^3 + \frac{F_A L_A}{4EI_A}x^2 \quad \text{(No. 7)}$$

which equals $$y_A = \frac{F_A W^3}{12EI_A}\left[-2\left(\frac{X}{W}\right)^3 + 3\left(\frac{L_A}{W}\right)\left(\frac{X}{W}\right)^2\right] \quad \text{(No. 8)}$$

which equals $$y_A = \frac{f_A W^4}{24EI_A}\left[-2\left(\frac{X}{W}\right)^3 + 3\left(\frac{L_A}{W}\right)\left(\frac{X}{W}\right)^2\right] \quad \text{(No. 9)}$$

combining equations (6) and (9) for total deflection $$y_{A\,total} = \frac{f_A W^4}{24EI_A}\left[3\left(\frac{L_A}{W}-\frac{1}{2}\right)\left(\frac{X}{W}\right)^2 - \left(\frac{X}{W}\right)^4\right] \quad \text{(No. 10)}$$

This deflection is matched by the deflection of roll 12 which also sustains a distributed load of 500 PLI. If roll 12 is loaded only by uniformly distributed load, a cubic term would be present as in equation (5), making matching of the elastic curves at all points impossible. An overhung load $F_B$ is necessary to make the moment and therefore the curvature non-zero at the edge of the web, to match the non-zero curvature of roll 10.

In FIG. 3, $f_B$ is the resultant distributed load (the upper load minus 500 PLI).

Similarly to equations (6) and (8):

$$y_B = \frac{f_B W^4}{48EI_B}\left[-2\left(\frac{X}{W}\right)^4 + 4\left(\frac{X}{W}\right)^3 - 3\left(\frac{X}{W}\right)^2\right] + \frac{F_B W^3}{12EI_B}\left[-2\left(\frac{X}{W}\right)^3 + 3\left(\frac{L_B}{W}\right)\left(\frac{X}{W}\right)^2\right] \quad \text{(No. 11)}$$

Equation (11) can equal the sum of equations (6) and (9) only if $f_B=f_A(I_b/I_A)$, $F_B=F_A(I_B/I_A)$, and $L_B=L_A$. A balance of forces requires that $F_B=f_B W/2$.

Roll 20 is loaded upward by the distributed load $f_C=f_B+500$ Lb/in. and downward by the concentrated loads $F_C=f_C W/2$. It will deflect downward at the web edge relative to the center, so that it must be crowned and/or skewed by a radial amount equal to the sum of the deflections of rolls 12 and 20. The deflection equation for roll 20 has the same form as equation (11) if ideal loading is achieved, and if the change in the moment of inertia by reason of the crowning is negligible:

$$y_C = \frac{f_C W^4}{48EI_C}\left[-2\left(\frac{X}{W}\right)^4 + 4\left(\frac{X}{W}\right)^3 - 3\left(\frac{X}{W}\right)^2\right] + \frac{F_C W^3}{12EI_C}\left[-2\left(\frac{X}{W}\right)^3 + 3\left(\frac{L_C}{W}\right)\left(\frac{X}{W}\right)^2\right] \quad \text{(No. 12)}$$

The design of roll 20 is an iterative process, since the deflection depends on the extent of the crown, and the required crown depends on the deflection. Further, the crown is correct for a single value of loading.

Equation 12, which assumes a cylindrical roll 20, provides the first step in the design of roll 20. The deflection of roll 12 (which is equal to the deflection of roll 10) is added to the deflection of roll 20, then the radius of roll 20 is changed point-by-point by amounts equal to the sum of the deflections. Subsequent calculations require a numerical procedure which allows the varying moment of inertia to be considered. If the new calculations result in radii of roll 20 which are significantly different from the previously calculated radii, another iteration is performed.

Furthermore the equations based on the theory of beam bending (without consideration of the deflections caused by shear stresses) are approximations which become less accurate as rolls become shorter in relation to their diameters. In order to achieve matching of deflections of rolls 10 and 12 to within a few micro inches, it was necessary to consider deflections caused by shear stresses and to adjust the loadings $f_B$ and $f_C$ slightly from the values predicted by the beam equations. An alternative would be analysis of deflections on a computer by the finite element method, possibly using a non-uniform loading on roll 12 as imposed by roll 20.

The following parameters have been found to provide the compensating and balanced condition for the present invention, where one-half of the roll dimensions are given, the other half being a mirror image of the first half.

TABLE I

Dimensions of Roll 20

| Station Number | Distance from Center Roll | Diameter/ Inches |
|---|---|---|
| 1 | 0.0000 | 1.97300 |
| 2 | 0.5846 | 1.97259 |
| 3 | 1.1692 | 1.97137 |
| 4 | 1.7538 | 1.96936 |
| 5 | 2.3384 | 1.96658 |
| 6 | 2.9230 | 1.96308 |
| 7 | 3.5076 | 1.95890 |
| 8 | 4.0922 | 1.95411 |
| 9 | 4.6768 | 1.94879 |
| 10 | 5.2614 | 1.94302 |
| 11 | 5.84670 | 1.93691 |

To achieve the loading of 500 PLI, the total load applied at the bearings of the crowned roll 20, $F_C$, is 3,637.3 pounds. The upward forces applied to each baring 25 by the springs 30 and 32 is 714.1 pounds. The net loading applied by the crowned roll 20 is 622.15 PLI, and the net loading for roll 12 is $f_B=122.15$ PLI. The bearing loading for the roll 10 is $F_A=2,923.2$ pounds. The bearing loading for roll 12 is $F_C=3,637.3$ pounds.

It will therefore be seen that this invention provides a fully compensated three-roll press which uniformly applies a force across the full predetermined width of a web, at the nip. It does this by matching the deflection curves of the two cylindrical rolls defining the nip, and this match is accomplished by providing a compensating force to the intermediate roll.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. In a three-roll press calender useful for the pressure fixing of toner images and the pressure development of microencapsulated latent images on web material in which one of a pair of parallel cylindrical pressing rolls, forming a pressing nip therebetween is loaded by a pressure roll by the application of a uniformly distributed force so as to urge said one pressing roll into engagement with the other said pressing roll along said nip under load and causing said pressing rolls to bend along common deflection curves and in which said pressing rolls are wider than said web material, wherein the improvement comprises:
means for matching the deflection curve of said one pressing roll to that of the other pressing roll at the edges of such web therebetween,
said means including means applying a constant biasing force to said one pressing roll urging the ends thereof toward said pressure roll by an amount proportional to the internal moment at locations corresponding to the edges of said web on said other pressing roll.

2. The three-roll press of claim 1 in which said pressure roll is a cylindrical roll mounted on an axis skewed to the axes of said pressing rolls.

3. The three-roll press of claim 1 in which said pressure roll is crowned roll and has an axis parallel to the axes of said pressing rolls.

4. In a three-roll single nip-type calender press useful for the pressure fixing of toner images and the pressure development of microencapsulated latent images on web material including a pair of substantially equal length cylindrical pressing rolls mounted on parallel axes and defining a pressure nip therebetween, and a crowned loading roll for applying a loading force to one of said pressing rolls and causing said pressing rolls to bend along common deflection curves and in which pressing rolls are wider than said web material, wherein the improvement comprises:
means for compensating for a mismatch between the deflection curves of said pressure rolls,
said means including compensating spring mans urging said one pressing roll toward said crowned roll with a constant force which is proportional to the positive moment in the other of said pressure rolls substantially at locations corresponding to the lateral edges of said material in said nip.

5. The press of claim 4 further comprising bearing means for said one pressing roll positioned outboard thereof, and said spring means includes leaf springs having one anchored end and an operative end supporting said bearing means.

6. A press useful for the pressure fixing of toner images and the pressure development of microencapsulated latent images on web-type material, comprising:
a first solid cylindrical roll,
a second solid cylindrical roll having substantially the same effective length as that of said first roll,
means mounting said second roll in nip-defining, superimposed, parallel relation to said first roll defining a common press nip therebetween and in which said rolls are wider than said web-type material,
loading roll for causing said first and second rolls to bend along common deflection curves,
means mounting said loading roll in superimposed force-applying relation to said second roll, and
constant force means operating substantially at the ends of said second roll urging said second roll toward said loading roll with a force which is proportional to the positive moment in said first roll at axial locations corresponding to the position of the edges of said material on said first roll in said nip wherein the deflection curves of the first and second rolls at the edges of said web- type material are matched.

7. The press of claim 6 in which said loading roll is crowned.

8. The press of claim 6 in which said loading roll is cylindrical and is mounted on an axis skewed to the axes of said first and second rolls.

* * * * *